United States Patent
Schmitt-Weaver et al.

(10) Patent No.: US 9,507,279 B2
(45) Date of Patent: Nov. 29, 2016

(54) METHOD OF OPERATING A LITHOGRAPHIC APPARATUS, DEVICE MANUFACTURING METHOD AND ASSOCIATED DATA PROCESSING APPARATUS AND COMPUTER PROGRAM PRODUCT

(71) Applicant: ASML Netherlands B.V., Veldhoven (NL)

(72) Inventors: Emil Peter Schmitt-Weaver, Eindhoven (NL); Paul Frank Luehrmann, Eindhoven (NL); Eduardus Johannes Gerardus Boon, Weert (NL); Daan Maurits Slotboom, Rhenen (NL); Jean-Philippe Xavier Van Damme, Wezembeek-Oppem (BE); Wolfgang Henke, Kempen (DE); Alexander Ypma, Veldhoven (NL); Marc Jurian Kea, Den Dungen (NL)

(73) Assignee: ASML Netherlands B.V., Veldhoven (NL)

( * ) Notice: Subject to any disclaimer, the term of this patent is extended or adjusted under 35 U.S.C. 154(b) by 287 days.

(21) Appl. No.: 14/069,287

(22) Filed: Oct. 31, 2013

(65) Prior Publication Data
US 2014/0168627 A1  Jun. 19, 2014

Related U.S. Application Data

(60) Provisional application No. 61/737,345, filed on Dec. 14, 2012.

(51) Int. Cl.
*G03F 7/20* (2006.01)
*G03F 9/00* (2006.01)

(52) U.S. Cl.
CPC ........... *G03F 7/70908* (2013.01); *G03F 7/707* (2013.01); *G03F 7/7085* (2013.01); *G03F 7/70916* (2013.01); *G03F 9/70* (2013.01)

(58) Field of Classification Search
CPC .. G03F 7/707; G03F 7/70483; G03F 7/7085; G03F 7/70491; G03F 7/70916; G03F 1/44; G03F 7/70783; G03F 7/70875; G03F 7/70633; G03F 9/7046; G03F 7/705; G03F 7/70908; H01L 22/20; G05B 15/02
See application file for complete search history.

(56) References Cited

U.S. PATENT DOCUMENTS

| | | |
|---|---|---|
| 6,788,988 B1 | 9/2004 | Pasadyn et al. |
| 2006/0227307 A1* | 10/2006 | Tel ...................... G03F 7/70783 355/53 |
| 2011/0043775 A1* | 2/2011 | Van De Kerkhof ... G03B 27/68 355/52 |
| 2012/0133914 A1 | 5/2012 | Prosyentsov et al. |

* cited by examiner

*Primary Examiner* — Michelle M Iacoletti
(74) *Attorney, Agent, or Firm* — Sterne, Kessler, Goldstein & Fox P.L.L.C.

(57) ABSTRACT

A reticle is loaded into a lithographic apparatus. The apparatus performs measurements on the reticle, so as to calculate alignment parameters for transferring the pattern accurately to substrates. Tests are performed to detect possible contamination of the reticle or its support. Either operation proceeds with a warning, or the patterning of substrates is stopped. The test uses may use parameters of the alignment model itself, or different parameters. The integrity parameters may be compared against reference values reflecting historic measurements, so that sudden changes in a parameter are indicative of contamination. Integrity parameters may be calculated from residuals of the alignment model. In an example, height residuals are used to calculate parameters of residual wedge (Rx') and residual roll (Ryy'). From these, integrity parameters expressed as height deviations are calculated and compared against thresholds.

9 Claims, 7 Drawing Sheets

METHOD OF OPERATING A LITHOGRAPHIC APPARATUS, DEVICE MANUFACTURING METHOD AND ASSOCIATED DATA PROCESSING APPARATUS AND COMPUTER PROGRAM PRODUCT

BACKGROUND

Field of the Present Invention

The present invention relates to a method for operating a lithographic apparatus. The present invention further relates to methods of manufacturing devices using lithographic apparatus calibrated by such a method, and to data processing apparatuses and computer program products for implementing parts of such a method.

Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction.

In the lithographic process, particularly where mass production of the most sophisticated products is required, many components and subsystems must work together with optimum performance to ensure accurate formation of device features at the correct locations on a substrate. Subsystems can lose integrity for a number of reasons, and any processing of substrates that are defective as a result can be very costly indeed. A particular issue is contamination of the patterning device (reticle) and/or the support and clamping arrangements that support it, leading to deformation or displacement of the reticle. This can degrade patterning performance of the lithographic process as a whole. The degraded performance may be detected when patterned substrates are subjected to inspection. However, by that time, a number of substrates may have been processed, and the cost and risk associated with re-working them is substantial. On the other hand, any dedicated inspection or measurement of the patterning device for the purpose of detecting contamination would only reduce the throughput of the process in normal operation.

SUMMARY

The embodiments aim to enable early detection of contamination issues around a patterning device, without reducing throughput of the lithographic process in normal operation. Embodiments of the embodiments enable rapid detection of loss of integrity based on observations made already as part of a reticle alignment process.

In a first aspect, the present embodiment provides a method of operating a lithographic apparatus, the lithographic apparatus being arranged in normal operation to transfer a pattern from a patterning device to a desired position on a substrate, the method comprising the following steps: supporting a patterning device in the lithographic apparatus; performing measurements on features of the patterning device, the results of said alignment measurements being used in normal operation in calculating alignment parameters for use in controlling the transfer of the pattern to one or more substrates; performing on the basis of said measurements one or more integrity tests to identify a contaminated condition of the patterning device or its support; and depending on the result of said integrity test, determining whether to proceed with operating the lithographic apparatus to apply the pattern to one or more substrates.

The integrity test may use parameters of the alignment model as integrity parameters. Alternatively or in addition, the integrity test may be based at least partly on residual values of the alignment measurements, the residuals being those parts that are not modeled by the alignment parameters. In an embodiment, residual values are used that represent the difference between height values measured at a number of points on the patterning device, and height values represented by the alignment model.

The method may further comprise initiating further inspection or cleaning of the patterning device in response to detection of an anomalous condition.

The method may further comprise making measurements of an applied pattern on one or more substrates, defining a modified integrity test based on a combination of the measurements, and using said modified integrity test in future performances of the method.

The embodiments further provide a method of manufacturing a device wherein a lithographic apparatus is used to apply a device pattern to a device substrate by a method according to the embodiments as set forth above.

The embodiments may be implemented by suitable programming of existing control systems of lithographic apparatus and associated equipment, and/or using separate data processing apparatus.

The embodiments further provide a data processing apparatus programmed to perform an integrity test for a lithographic apparatus in accordance with step (c) of a method according to the embodiments as set forth above, based on a set of alignment measurements.

The data processing apparatus may be further programmed to cause the lithographic apparatus to use a stored recipe that defines a sequence of repetitions of step (b) and associated parameter variations.

The embodiments further provides a computer program product comprising instructions for causing a programmable data processing apparatus to perform as the data processing apparatus of the embodiments as set forth above.

These and other features and advantages of the present embodiments will be understood by the skilled reader from a consideration of the exemplary embodiments discussed below. Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

Figure 1:
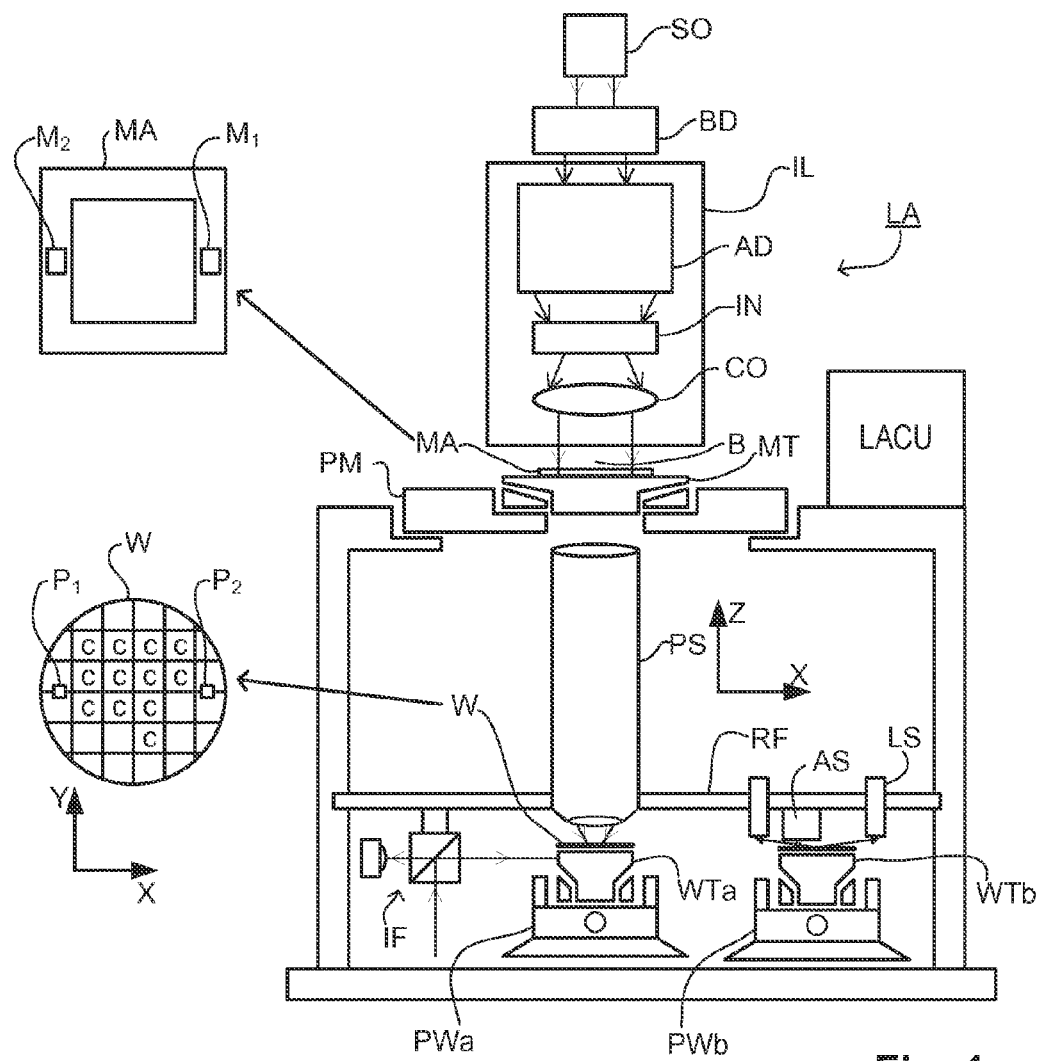
FIG. 1 depicts a lithographic apparatus, according to an embodiment of the present invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

FIG. 1 schematically shows a lithographic apparatus LAP including a source collector module SO according to an embodiment of the invention. The apparatus comprises: an illumination system (illuminator) IL configured to condition a radiation beam B (e.g., EUV radiation); a support structure (e.g., a mask table) MT constructed to support a patterning device (e.g., a mask or a reticle) MA and connected to a first positioner PM configured to accurately position the patterning device; a substrate table (e.g., a wafer table) WT constructed to hold a substrate (e.g., a resist-coated wafer) W and connected to a second positioner PW configured to accurately position the substrate; and a projection system (e.g., a reflective projection system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure. The two substrate tables WTa and WTb in the example of FIG. 1 are an illustration of this. The invention disclosed herein can be used in a stand-alone fashion, but in particular it can provide additional functions in the pre-exposure measurement stage of either single- or multi-stage apparatuses.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PWa/PWb and position sensor IF (e.g. an interferometric device, linear encoder or capacitive sensor), the substrate table WTa/WTb can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WTa/WTb may be realized using a long-stroke module and a short-stroke module, which form part of the second positioner PWa/PWb. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WTa/WTb are kept essentially stationary, while an entire pattern imparted to the radiation beam is projected onto a target portion C at one time (i.e. a single static exposure). The substrate table WTa/WTb is then shifted in the X and/or Y direction so that a different target portion C can be exposed. In step mode, the maximum size of the exposure field limits the size of the target portion C imaged in a single static exposure.

2. In scan mode, the mask table MT and the substrate table WTa/WTb are scanned synchronously while a pattern imparted to the radiation beam is projected onto a target portion C (i.e. a single dynamic exposure). The velocity and direction of the substrate table WTa/WTb relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WTa/WTb is moved or scanned while a pattern imparted to the radiation beam is projected onto a target portion C. In this mode, generally a pulsed radiation source is employed and the programmable patterning device is updated as required after each movement of the substrate table WTa/WTb or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA is of a so-called dual stage type which has two substrate tables WTa and WTb and two stations—an exposure station and a measurement station—between which the substrate tables can be exchanged. While one substrate on one substrate table is being exposed at the exposure station, another substrate can be loaded onto the other substrate table at the measurement station so that various preparatory steps may be carried out. The preparatory steps may include mapping the surface of the substrate using a level sensor LS and measuring the position of alignment markers on the substrate using an alignment sensor AS. This enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations.

The apparatus further includes a lithographic apparatus control unit LACU which controls all the movements and measurements of the various actuators and sensors described. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus. For example, one processing subsystem may be dedicated to servo control of the substrate positioner PWa/PWb. Separate units may even handle coarse and fine actuators, or different axes. Another unit might be dedicated to the readout of the position sensor IF. Overall control of the apparatus may be controlled by a central processing unit, communicating with these sub-systems processing units, with operators and with other apparatuses involved in the lithographic manufacturing process.

Combinations and/or variations on the above described modes of use or entirely different modes of use may also be employed.

Figure 2:
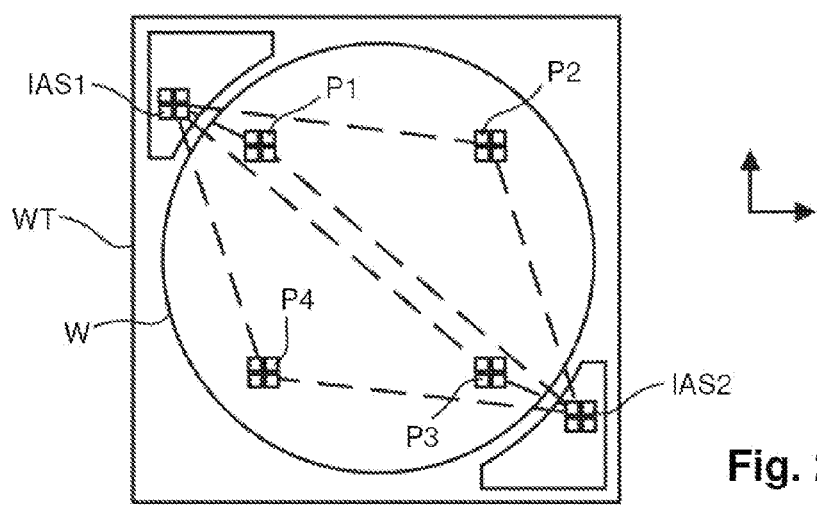
FIG. 2 is a schematic plan view of a substrate table and substrate in the apparatus of FIG. 1, showing alignment marks and sensors useful in one embodiment of the invention.

FIG. 2 schematically depicts an arrangement of the substrate table WT depicted in the lithographic apparatus of FIG. 1, in which the substrate table WT is provided with an embodiment of the image sensor according to the invention. In the substrate table WT, two image sensors IAS1 and IAS2 are provided. The image sensors can be used to determine a location of an aerial image of a pattern, e.g. an object mark, on the mask MA by scanning the image sensor IAS1 or IAS2 through the aerial image. Substrate alignment marks P1 to P4 are shown also.

Figure 3A:
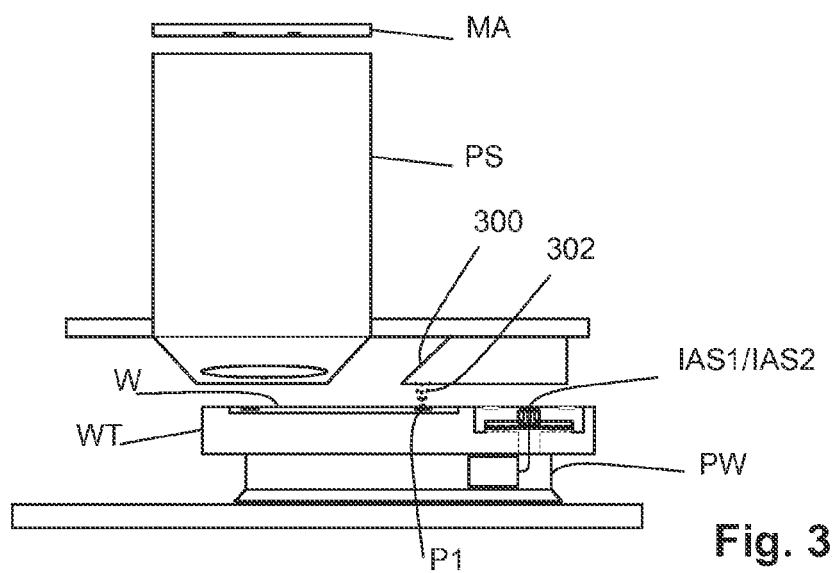
FIGS. 3A to 3C show steps in a known alignment process using the substrate table of FIG. 2.
Figure 3B:
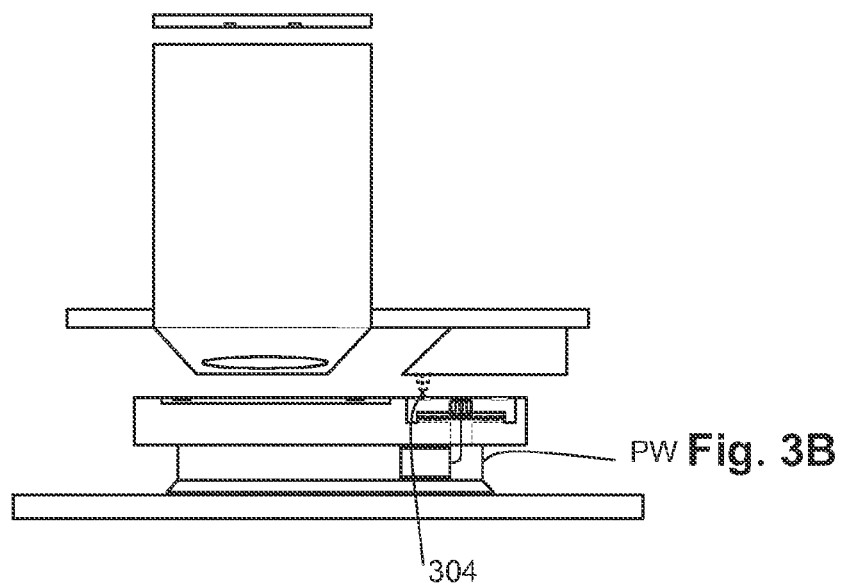
Figure 3C:
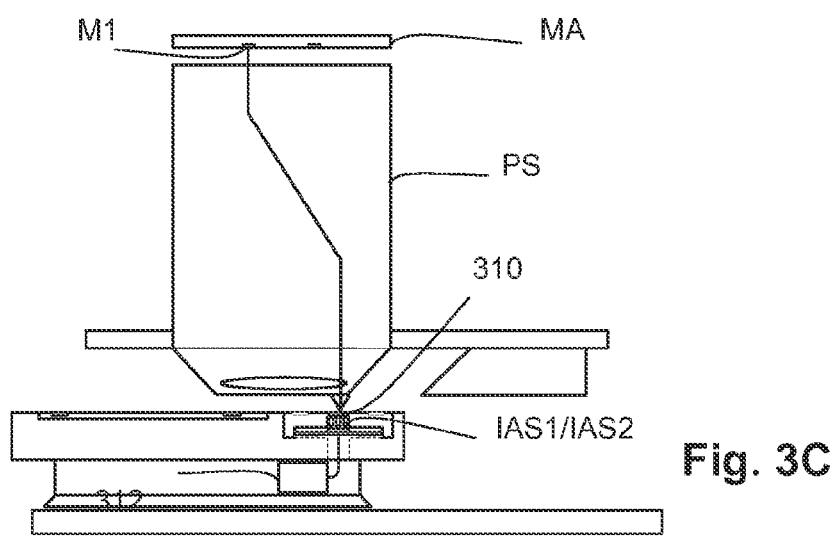

FIGS. 3A to 3C illustrate steps in the alignment process using the sensors IAS1, IAS2. In addition to the parts generally labeled the same as in FIG. 1 and FIG. 2, an alignment sensor 300 is provided to direct an alignment radiation beam 302 in the direction of the substrate W and/or substrate table WT. Sensor 300 detects the properties of the beam 302 when reflected, in order to detect alignment of the sensor 301 to patterns such as P1-P4, illustrated. As shown in FIG. 3B, movement of the substrate table WT, which is measured accurately by sensor IF (shown in FIG. 1) can bring alignment of the radiation beam 302 to bear also on alignment mark 304 which is accurately placed relative to image sensor IAS1, IAS2 etc. Additionally, as shown in FIG. 3C, substrate table WT can be moved to bring image sensor IAS1, IAS2 etc. into the position of an aerial image 310, which is the projection through projection system PS of a mark such as mark M1 on the mask MA. Electronic system 312 detects properties of this aerial image 310, as it is received by sensors IAS1, IAS2, during translational movements of the substrate table WT, to locate in all degrees of freedom the exact location where the last alignment mark M1 projects with optimum alignment (X-Y) and optimum focus (z) onto the sensor IAS1.

By means of the image sensors IAS1 and IAS2, when their position in the substrate table is well-known, the relative position of the aerial image of the pattern on the mask MA with respect to the substrate table WT can be determined. The substrate table WT may be provided with a substrate W comprising substrate marks, e.g. substrate marks P1, P2, P3, P4 as depicted in FIG. 2. Alignment sensor 302, in co-operation with position sensor IF, can obtain relative positions of the substrate marks P1, P2, P3, P4. The knowledge of the relative positions of the substrate marks P1, P2, P3, P4 can be obtained by the alignment sensor steps illustrated in FIGS. 3A and 3B. The relative position of the image of the object mark on the mask MA with respect to the wafer table WT can be deduced from information obtained with the image sensors IAS1, IAS2, (FIG. 3C). These data allow the substrate W to be positioned at any desired position relative to the projected image of the mask MA with great accuracy.

It must be understood that instead of two image sensors IAS1 and IAS2, more or fewer image sensors may be present, e.g. one or three. The form of these sensors and electronics is known to the skilled person and will not be described in further detail. Alternative forms of alignment mechanism are possible, and useful within the scope of the present invention. In other embodiments, it may be possible to dispense with image sensors IAS1, IAS2, or to provide them on a support separate from the wafer table which carries the substrate.

Condition Monitoring

First Example

Figure 4:
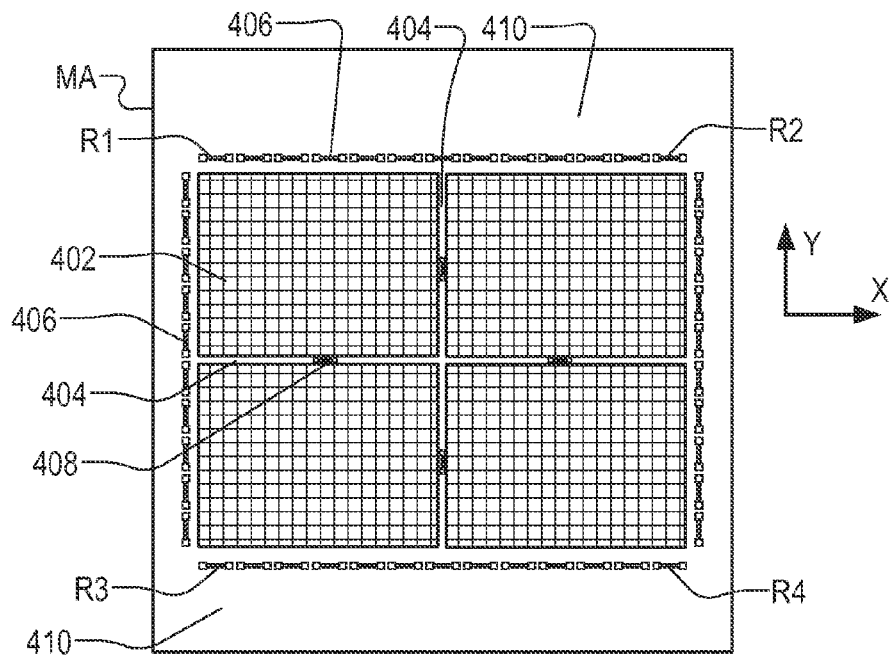
FIG. 4 shows in more detail an example of a patterning device (reticle) with alignment marks usable in embodiments of the present invention.

FIG. 4 illustrates the general layout and form of a typical reticle MA, in more detail than is shown in FIG. 1. The field that can be patterned in one pass by the apparatus is generally larger than individual product dies (dice) that are to be cut from the finished substrate at the end of all lithography and process steps. Therefore the reticle in this example includes four device areas of which one is labeled 402. The hatching represents device patterns that are to be applied to define product features of four dice simultaneously. Scribe lane areas 404 lies between the device areas. Around the periphery of the device areas and within the scribe lane areas, reticle alignment marks 406 and 408 are distributed. Four particular ones of the marks 406 are at the corners of the patterned area and are labeled R1, R2, R3, R4 in the diagram. These correspond to the marks M1 and M2 indicated schematically in FIGS. 1 and 3C, and each allows a measurement of X, Y and Z (height) position relative to the transmission image sensor IAS1 or IAS2. In a known example apparatus, sensors are position so that two marks R1, R2 or R3, R4 can be measured simultaneously.

Additional marks around the periphery and in the scribe lanes are provided to permit enhanced measurements of the reticle shape. Shape distortion can arise for example due to reticle heating during operation. Procedures and mechanisms may be applied to measure reticle shape and to apply corrections during operation. These are not part of the present disclosure, but can be applied in addition, as required. Suitable mechanisms are described for example in published patent application US 2012/0133914, which is incorporated by reference herein in its entirety.

Outside the patterned area, clamping areas 410 are provided to be engaged by the mask table MT. In the case of a transmissive reticle, such as the one used in the apparatus of FIG. 1, the mask table MT has a central aperture and the clamping surfaces may be at two or more edges of the reticle, as shown. Clamping forces may be provided for example by suction, and/or mechanical clamping. In the case of a reflective reticle, as used for example in EUV lithography, support and clamping may be provided across the entire back side of the reticle. Clamping may be achieved for example by electrostatic force, as the vacuum environment for EUV lithography does not allow suction to work.

Figure 5:
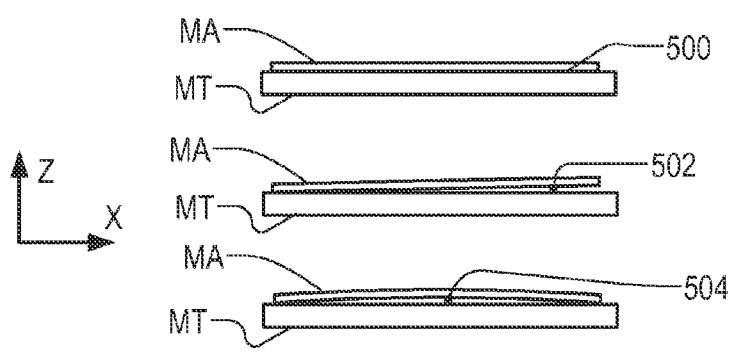
FIG. 5 illustrates a problem of contamination between a patterning device and a mask table in the apparatus of FIG. 1.

FIG. 5 illustrates problems caused by contamination of the patterning device (reticle) MA in the apparatus of FIG. 1. Such contamination is just one example of a condition where a subsystem of the apparatus loses integrity to an extent that the performance of the lithographic process is compromised. Three example cases are illustrated from top to bottom. In the ideal situation (top image), reticle MA is held flat against clamping surfaces of the mask table (MT), with a clean interface 500. In the middle image, a contaminant particle 502 is disturbing the interface near one edge of the reticle, causing the reticle to be tilted relative to the clamping surface. In the bottom image, contaminant particle 504 is located near the middle of the reticle, causing the reticle to adopt a bowed (curved) shape. Depending on the type of reticle and clamping mechanism, it will be understood that these disturbances may be present in different forms in two dimensions, while only a schematic view along one dimension is illustrated here. Displacement of part of the reticle in the Z direction directly challenges the ability of the apparatus to focus an image of the pattern onto the substrate W, leading for example to poor contrast and reduced line width (CD). Such displacement in the Z direction can also distort the applied pattern in the X and Y directions, leading to increased overlay error. Therefore great care is taken to avoid contamination, but it cannot be eliminated.

Figure 6:
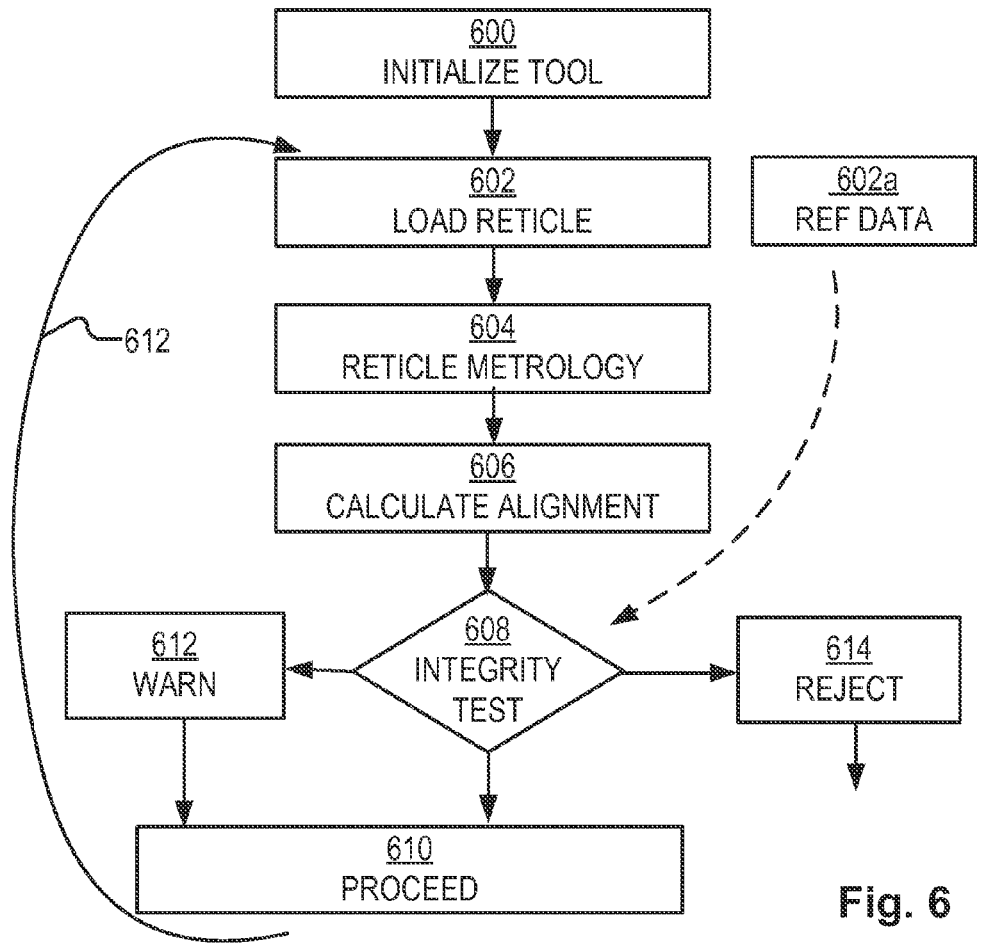
FIG. 6 is a flowchart of a method of operating a lithographic apparatus in accordance with a first embodiment of the present invention.

FIG. 6 is a flowchart illustrating a method of integrity testing prior to exposure, that can be implemented in the lithographic apparatus of FIG. 1. The method begins at step 600 with initialization of the apparatus. At 602 a reticle MA is loaded onto support MT and at 604 metrology is performed to measure the positions of various marks, including the transmission image marks 406, 408. At step 606, the measurements are used to define an alignment, aligning the projected pattern with the target portion C on the substrate W. The model chosen is a matter of implementation. The aim of the model is to represent deviations dx and dy between the actual imaged position of features on the reticle, compared with an ideal grid. These deviations are defined in the plane of the image formed on the substrate, but may be influenced by height deviations of the reticle due to the performance of the projection system PS.

The manner in which the model is expressed is a matter of design choice. In the present embodiments, the deviations dx, dy at each point within the pattern defined by the reticle, are expressed as a combination of certain components, that will be described in more detail with reference to FIG. 9. The values of x and y may be defined with respect to an origin (0,0) at the centre of the reticle pattern area, for example. The parameter representation can be transformed to and from different forms of expression, for example taking the forms of polynomials in x and y. For example, the model may be created by fitting polynomial equations in x and y to the observed measurements, so that the alignment is defined by values of coefficients of the various terms for the polynomials. In one embodiment, certain higher-order coefficients of the polynomial model are used as integrity parameters, as will be described below. The polynomial expression can also be transformed into a different parameter space, having the more 'physical' parameters illustrated in FIG. 9.

Depending on which parameters of the projection system and positioning subsystems of the apparatus can be controlled in real time, only some terms of these alignment parameters can be corrected during exposure. Others may be correctable within a limited range only. The remaining terms (residuals, or residual parts of terms) represent non-correctable errors (NCEs). Some errors that could in principle be corrected by suitable programming of the apparatus, may for operational reasons be left uncorrected. These may also be considered residuals. Either the correctable errors or the residuals can contain useful diagnostic information. Such information can for example be exploited in the integrity check to detect possible contamination issues. Accordingly the integrity parameters can be based on correctable terms, residual terms or a combination of both.

In the new method of FIG. 6, in step 608 the results of the reticle metrology step 604 are used to perform an integrity test on the mounted reticle, prior to proceeding at step 610 to load and expose substrates. This test can take many forms. As a parameter representing integrity, the test may use individual parameters that are already explicitly defined in the alignment model, it may use a combination of parameters from the alignment model, or it may use a special parameters calculated independently of the alignment model, but still based on the measurement made in step 604. Examples of particular integrity parameters will be described further below. An example of the integrity test in step 608 is to obtain one or more integrity parameter(s) using the measurements performed for reticle alignment, and to compare it with a threshold. If the parameter is above a first threshold, the use of the reticle may proceed, but with a warning being displayed and/or logged for later attention (step 612). If the value exceeds a second, higher threshold, control passes to step 614 and the reticle is rejected before any substrates are exposed.

The integrity test thereby solves the current problem of substrates being exposed and processed, only to turn out to be defective and requiring expensive rework. To make the test more sensitive specifically to effects of contamination, the test may make use of reference data associated with the reticle and/or the apparatus. The reference data may be loaded in a step 602a at the same time as the reticle itself is loaded in step 602. The reference data may specify thresholds, or reference values against which the parameter will be compared in the integrity test.

Any reticle that is rejected can be subjected to additional inspection and/or cleaning operations, before being tried again. Provided that the integrity parameter(s) is truly representative of contamination situations, and provided the thresholds are set appropriately, unnecessary rejections are avoided. For a reticle that is not rejected but gives rise to a warning, protocols may be implemented to check and/or clean the reticle before subsequent use. In this way, even if the errors caused by contamination are entirely correctable, action can be taken to anticipate the accumulation of contamination, and to avoid rejection on a next use. Also, early detection and cleaning will reduce the amount of contamination that is transferred from machine to machine when a reticle is used in different tools from time to time.

Where there is more than one integrity parameter, these may be compared to the same or different thresholds, and the results of the tests used in combination to decide whether to proceed, warn or reject. The thresholds may be adaptive, or programmed as absolute values.

Figure 7A:
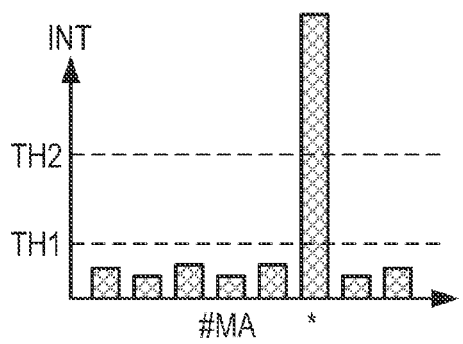
FIGS. 7A and 7B illustrate integrity parameter values being compared against thresholds in the method of FIG. 6.

FIG. 7A illustrates values of an integrity parameter INT calculated for a number of different reticles in a set of reticles loaded into a lithographic apparatus. Thresholds TH1 and TH2 are defined in advance. Each reticle is identified by a reference #MA, and the set of reticles may correspond to different layers within the structure of a single product. Each reticle is loaded when needed into the lithography apparatus, and the alignment method of FIG. 6 is performed. The majority of the reticles in the set yield integrity parameter values below the lower threshold TH1 and for these reticles flow passes directly to step 610. For one reticle, marked with a '*' symbol, the integrity parameter value exceeds the higher threshold TH2, triggering a rejection (step 614).

Note that the integrity parameters in this example are illustrated with zero as their perfect value. It may be that an integrity parameter is first derived for which some non-zero reference value represents a the ideal value. The threshold may then be applied to the difference between the integrity parameter and the reference value. To some extent, this is a matter of expression in the data processing, rather than a material difference in the method. It would be easy simply to define the integrity parameter (or the threshold) with the reference value subtracted (added). However, defining the reference value separately allows more customization of the test, to ensure sensitivity to contamination without the risk of unnecessary rejections.

For example, it may be convenient to set the thresholds as global parameters the same for all reticles, while setting reference values that are specific to the type of reticle, or the individual reticle, and/or the individual apparatus in which it is mounted. For example, the lithographic apparatus may be designed to accommodate quite wide variations in the value of the parameter that is being used as an integrity parameter, while contamination may cause only a small variation in comparison. By defining a reference value and monitoring for deviations relative to that, the thresholds can be set sensitively enough to detect the effects of contamination more reliably. An example of this will be illustrated in FIG. 7B. The reference values may be data stored for each reticle and/or apparatus, and retrieved at step 602a when the reticle is loaded into the apparatus. The reference data from step 602a can then be used in the integrity test at step 608, as illustrated in FIG. 6.

Figure 7B:
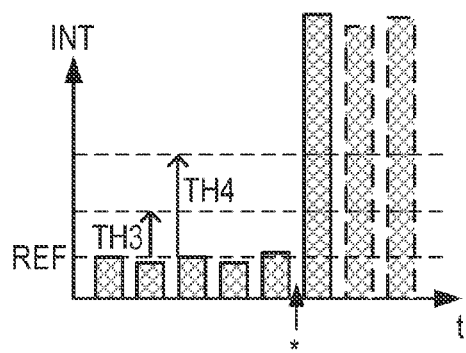

In FIG. 7B, we see measurements of integrity parameter INT performed at different times of using the same reticle. Thresholds TH3 and TH4 are defined relative to a reference value REF, rather than to zero of the parameter INT. The reference value REF can be derived for example from the historic values established for the particular parameter INT on this particular reticle. The reticle passes the integrity test on several occasions. However, by some accident during the interval marked with a '*', the reticle or the mask table or clamping device picks up some contamination. The next time the reticle is loaded and the alignment is performed, the integrity test reveals the contamination as the difference between the measured value of parameter INT value and the reference value REF is greater than threshold TH4. The reticle is rejected and wasted processing of substrates is avoided. The subsequent uses of the same reticle may be avoided, as shown in broken outline. The reference values REF may be received as part of the reference data in step 602a.

In other implementations, the thresholds TH3 and TH4 may be absolute thresholds, similar to thresholds TH1 and TH2, but set on historical data for the reticle. The thresholds in that case can again be received as part of the reference data in step 602a. They may be specific to the individual reticle or type of reticle, and/or the individual apparatus, even the individual substrate table (chuck) WTa/WTb.

The thresholds can be defined as constant terms, or adaptively. For example, each threshold TH1, TH2 may each be defined as a certain factor above the mean or median value across reticles. Thresholds TH3, TH4, or the reference value REF against which they are defined, may each be defined with reference to historic values observed for that reticle, so that a sudden change in value signals a contamination incident but a gradual change does not. In a further application, the same reticle may be loaded into different lithographic apparatuses. Again, upon loading into one tool, it may be noted that this reticle, indeed several reticles, exhibit higher values of the integrity parameter than they have on other tools. This points to a problem with contamination on the tool, rather than the reticle itself.

Figure 8:
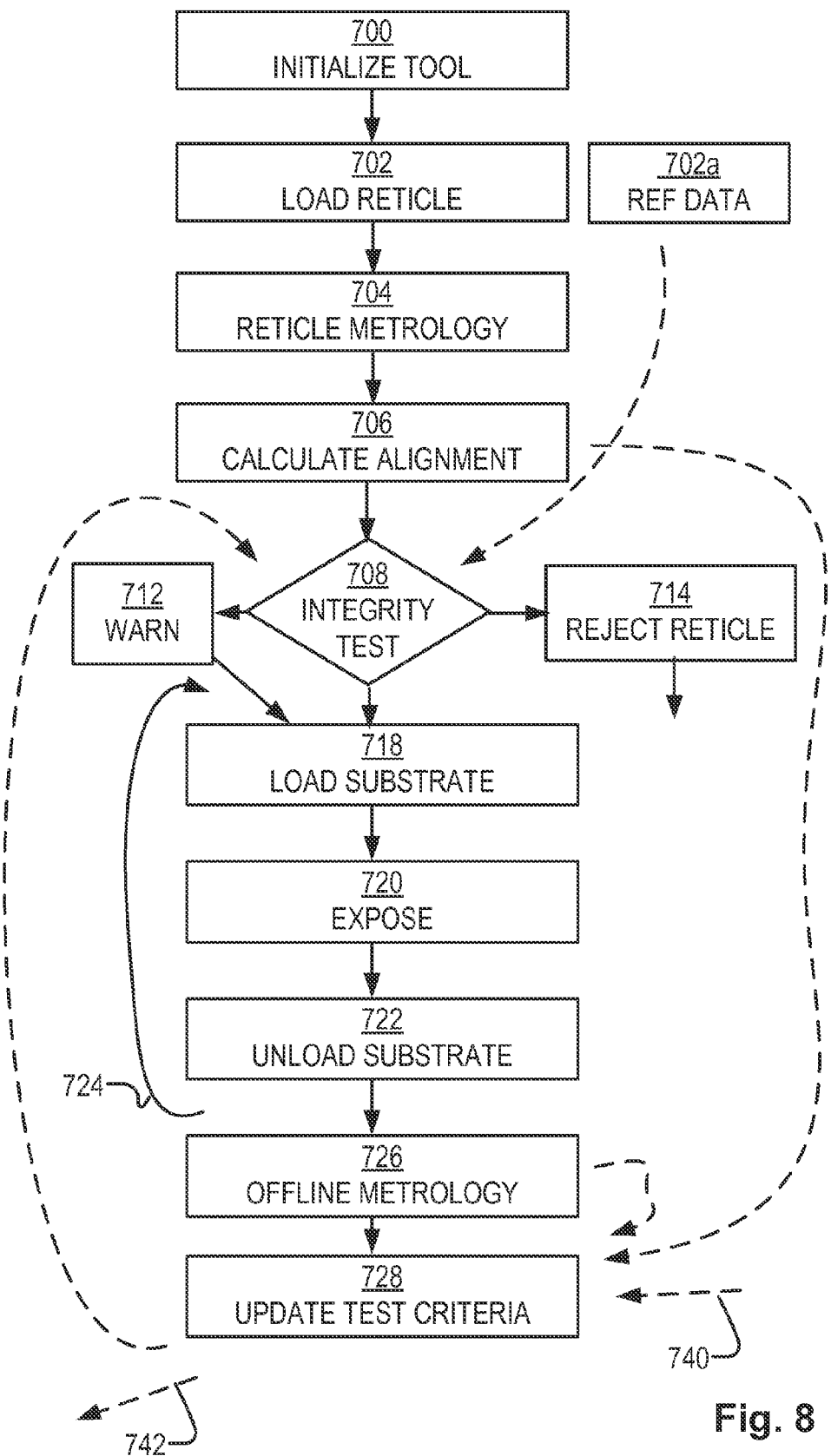
FIG. 8 is a flowchart of a method of operating a lithographic apparatus in accordance with a second embodiment of the present invention.

FIG. 8 is a flowchart of a second method of integrity testing. The steps 700 to 714 correspond exactly to the steps 600 to 614 of the method of FIG. 6 and will not be described again in detail. The difference between the second method and the first is that the criteria applied in the integrity test of step 708 are updated based on additional observations, in order to improve accuracy of detecting loss of integrity, without undue false reporting. The additional information can be fed from various sources. In the present example, it includes measurements performed on substrates that have been exposed (or generally, patterned) by the apparatus and/or similar apparatuses.

So, expanding on the 'proceed' step 610 that was shown in FIG. 6, and assuming that the integrity test at 708 does not reject the reticle, a substrate is loaded into the apparatus (718), measured and exposed to apply a pattern (720) and unloaded (722). At 724 to processing returns to step 718 for the processing of a next substrate, until a batch or lot of substrates have all had the desired pattern applied.

After unloading the substrates, measurements of the applied pattern are made in offline metrology step 726. The term 'offline' refers to the fact that patterning operations in the lithographic apparatus can continue while the substrate is measured, but post-exposure measurements can be performed within the lithographic apparatus, if desired. The results of these measurements are used for whatever quality control purposes are intended. However, they are also used at step 728 to modify or update the test criteria used in the integrity test for subsequent reticles, and/or for this particular reticle at subsequent steps. As an example, machine learning may be applied, based on the actual results of exposure, to define modified integrity parameters that are more sensitive to contamination issues. The or each integrity parameter may be defined for example as a weighted sum or other combination of all the coefficients in the alignment model. The integrity parameter may be defined as a weighted sum or other combination of other parameters, or of values measured from the reticle. The machine learning process uses information of the actual results of exposure to adjust the weightings of the weighted sum or other combination, in order to improve sensitivity. As another example, the thresholds applied for warning and rejection may be modified. The threshold may be adjusted and minimize false rejections. More than one integrity parameter may be defined, and the adjustment may adjust weightings and thresholds specific to each parameters.

The data paths involved in the adjustment process are indicated schematically with broken lines. It is a matter of implementation whether the feedback and adjustment of test criteria happens continuously or occasionally. In addition to data gathered from substrates exposed on the present lithographic apparatus, data gathered from several apparatuses can be aggregated to define modified test criteria, which in turn are applied across several apparatuses. Broken line path 740 represents incoming data from other apparatuses, while broken path 742 represents updated test criteria being distributed to other apparatuses. It will be appreciated that step 728 may be performed in a data processing apparatus separate from the lithographic apparatus itself.

Concerning what parameters may be used as integrity parameters, in a first illustrative example, polynomial equations are used to represent deviations dx and dy between the actual imaged position of features on the reticle, compared with an ideal grid. These deviations are defined in the plane of the image formed on the substrate and may be referred to as in-plane deviations. By contrast, height deviations may also be measured, as described in a second illustrative example, below.

Considering in-plane deviations, an example alignment model known in the art defines dx and dy by the following polynomials:

$$dx = k_1 + k_3 * x + k_5 * y + k_7 * x^2 + k_9 * xy + k_{11} * y^2 + k_{13} * x^3 + k_{15} * x^2 y + k_{17} * xy^2 + k_{19} * y^3,$$

$$dy = k_2 + k_4 * y + k_6 * x + k_8 * y^2 + k_{10} * yx + k_{12} * x^2 + k_{14} * y^3 + k_{16} * y^2 x + k_{18} * yx^2 + k_{20} * x^3,$$

According to these equations, the deviations dx, dy are defined in terms of the position x,y of each point within the pattern defined by the reticle. The values of x and y may be defined with respect to an origin (0,0) at the center of the reticle pattern area, for example. The coefficients $k_1$ to $k_{20}$ of the polynomials define the alignment for this reticle, on this occasion of use. These coefficients, or a subset of them, are used as input in the subsequent exposures of substrates to apply patterns at desired locations on the substrate. Depending on which parameters of the projection system and positioning subsystems of the apparatus can be controlled in real time, only some terms of these polynomial expressions can be corrected during exposure. The other terms represent non-correctable errors (NCEs). It may be for example that only the linear terms are corrected, using coefficients $k_1$ to $k_6$. The other coefficients representing NCEs can however contain useful diagnostic information, and the proposal here is that part of the NCE information can be exploited in the integrity check to detect possible contamination issues.

In this example, the model produced in step 606 is defined by the polynomial coefficients $k_1$ to $k_{20}$. In the step 608 or 708 as a parameter representing integrity, the test may use selected parameters such as coefficients k, from the polynomial alignment model. Which coefficient is sensitive to contamination will depend on the natures of the lithographic apparatus, and also on the location of the contamination. In one particular lithographic system, it has been observed for example that the coefficient $k_9$ is particularly sensitive to distortions caused by contamination between the substrate support and the reticle, or between the reticle and clamping surfaces, for example. Using again the example of coefficient $k_9$ as an integrity parameter, this value can be compared to thresholds. Other parameters, for example $k_{10}$ may also be used and compared to the same to different thresholds, and the results of the tests used in combination to decide whether to proceed, warn or reject. The thresholds may be adaptive, or programmed as absolute values. Reference values may be loaded in step 602a, 702a, as described above.

Integrity tests may thus use a combination of parameters from the alignment model, or it may use a special parameters calculated independently from the alignment model, but still based on the measurement made in step 604. As has been mentioned already, mathematical transformations can be used to convert physically-based parameters into polynomial coefficients and vice-versa. The coordinate system for a polynomial model need not be limited to x, y Cartesian coordinates. Other basis functions besides polynomials in x, y can be used.

Figure 9:
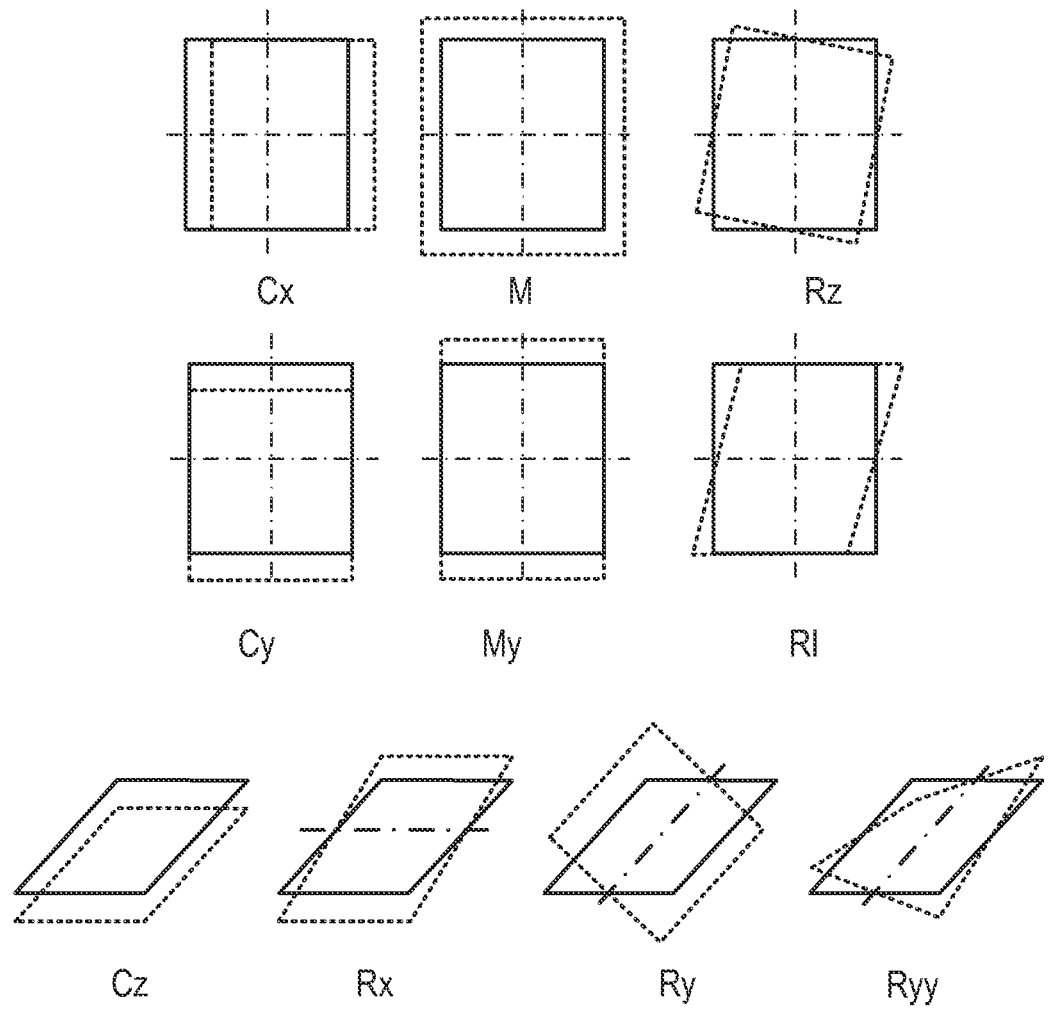
FIG. 9 illustrates certain alignment parameters defined in one embodiment of the invention.

With reference to FIG. 9, we now describe further examples of integrity tests. We present an example of an alignment model having more physically-based parameters, and identify parameters of the model that can be used as integrity parameters in the method of FIG. 6 or 8. In these examples, use will be made of measurements of the marks R1 to R4, identified on the example reticle of FIG. 4. As a simple example, a consistency check can be made on the difference in heights between the R1, R3 marks and the R2, R4 marks when they are measured with the same transmission image sensor (IAS1, IAS2). In this example, each sensor can read two marks simultaneously (R1 and R2 or R3 and R4). Each mark has two component gratings arranged to measure x and y position, and a height measurement can be made on each component grating separately. Height is measured on the two component gratings of every mark to obtain height readings as follows:

zxh (R1, R3)
zyh (R1, R3)
zxp (R2, R4)
zyp (R2, R4)

Here, zxh and zyh are results of height measurements on two component gratings of mark R1, and zxp and zyp are results of height measurements on two component gratings of mark R2. As mentioned, both R1 and R2 are measured in parallel by the same sensor (IAS1 or IAS2). The same is applicable for R3 and R4, they are measured in parallel. Results are named as zxh and zyh for the mark R3 and zxp and zyp for the mark R4.

Height differences DH1-DH4 are calculated as follows for use as integrity parameters:

$$DH1 = |\mathrm{max\_zxh} - \mathrm{min\_zxh}|$$

$$DH2 = |\mathrm{max\_zyh} - \mathrm{min\_zyh}|$$

$$DH3 = |\mathrm{max\_zxp} - \mathrm{min\_zxp}|$$

$$DH4 = |\mathrm{max\_zxp} - \mathrm{min\_zxp}|$$

where max_zxh represents the greatest of the measured height values for zx among the marks R1, R3 and min_zxh represents the lowest. Similarly, max_zxp represents the greatest of the measured height values for zx among the marks R2, R4 and min_zxp represents the lowest.

Threshold levels are set for warning and rejection. If any of these differences DH1 to DH4 exceeds the threshold, then a warning or rejection action is triggered in step 608 or 708. This is a simple test requiring vey little additional processing and no additional measurement steps over those required for the reticle alignment process. On the other hand, with this simple it may be difficult in some environments to set thresholds that are sufficiently low to detect contamination, without causing rejection of good reticles. More sophisticated tests combining the difference parameters have therefore been conceived, that will be described below. While the above example uses substantially the raw measurements from the metrology step 604, 704, the following example uses parameters more closely related to the alignment model calculated in step 606, 706.

Referring to FIG. 9, an alignment model in a practical example comprises a number of parameters that can be calculated from the measurements of the positions of the four marks R1 to R4. Each parameter represents a component transformation of the pattern area. Each component transformation is represented by a dotted quadrilateral, which is displaced or distorted in a particular way relative to the ideal or nominal rectangle in solid lines. This alignment model determines the following parameters relating the actual against the ideal relationship between positions on the reticle MA and positions on the substrate table WT: Magnification of the reticle (M), Rotation about the z axis (R), Translation in x and y of the reticle (Cx, Cy), Magnification in the y direction (My), and Scan skew (RI).

Although only four marks are measured in this example, they are measured each on the two different sensors (IAS1, IAS2), and each is measured in three dimensions. This additional information allows more than the six basic alignment parameters to be measured. These may include scaling variations arising in the substrate table (W) position encoder (sensor IF in FIG. 1). All of these parameters can be referred to as "in-plane" parameters.

Further parameters are available in the model, using the height components of measured positions, and these are particularly interesting for the integrity test in another embodiment. The model in the present example includes following height-related or "out-of-plane" parameters that are also illustrated in FIG. 9:

Height offset (Cz)
Tilt about the x axis, also referred to as "linear wedge" (Rx)
Tilt about the y axis (Ry)
Linear roll (Ryy)

These parameters of height offset Cz, Tilt or 'wedge' Rx, Tilt Ry, and Linear roll Ryy, all having the meaning indicated in the drawing. It is assumed in this case that the apparatus is of the scanning type, and that scanning proceeds in the y direction. This is the conventional coordinate system, but other coordinate systems and other labels for the axes are of course possible. As mentioned earlier, the patterning operation (exposure) can be controlled so as to correct for the deviations represented by some of these alignment parameters, but not necessary all of them. In an example apparatus, height offset is readily correctable, along with the six parameters listed earlier. On the other hand, the tilt Ry may be only partially correctable, and the linear wedge Rx, though correctable in principle, is not corrected for practical reasons. Residuals of this alignment are the parts of the measured deviations that cannot be corrected. In some embodiments of the present invention it is these residuals that are used as integrity parameters, that is, as input for the integrity test. Of course, parameters that are correctable can be used as integrity parameters, as discussed above. However, by definition, the errors that are correctable (and corrected) do not directly cause degradation in the pattern applied to the substrates, and need not trigger a rejection event. By selecting the residuals, the integrity test may be concentrated more precisely on the types of distortion that arise from contamination, and that cause degradation in the applied pattern.

Referring again to FIG. 5, the distortion effects illustrated there can be described at least approximately by linear y-wedge (parameter Rx) and by linear roll (parameter Ryy). Either or both of these parameters can be used as an integrity test, and compared to a threshold in step 606, 706. Recalling that different reticle clamping arrangements are known, the parameters most sensitive to contamination effects may vary between embodiments. For example, where a transmissive reticle is clamped only along two edges, one of Rx and Ry may be much more significant that the other. Where a reticle, for example a reflective reticle in an EUV lithographic apparatus, is clamped across its entire back surface, the parameters Rx and Ry may be equally significant as one another. Linear roll can be significant in either case. Therefore some embodiments are characterized by use of linear roll as well as one or both of linear wedge (tilt Rx) and tilt Ry, as integrity parameters.

While wedge and roll have been mentioned as parameters for detecting contamination causing certain types of distortion, the type of distortion will depend on the particular support mechanism applied in a given apparatus, and on the location of the contamination. Other parameters might be useful for detecting contamination in different locations, for example: magnification; difference in rotation Rz at the ends of the reticle (another form of linear roll).

The example just described uses parameters of the reticle alignment model, directly as integrity parameters. However, it may be that in a particular environment, quite large variations of these parameters are present and tolerated. The variations caused by contamination might be quite small in comparison with the 'normal' variation between reticles, or even between uses of the same reticle. In another embodiment, therefore, similar parameters are used as integrity parameters, but they are defined from residuals of the alignment model. As a particular example, parameters Rx' and Ryy' are defined for use as integrity parameters. These new parameters again represent reticle wedge and reticle roll at wafer level, but they model the residual height deviations, after subtraction of the modeled alignment that includes wedge and roll and the other parameters illustrated in FIG. 9. The integrity parameters Rx' and Ryy' of residual wedge and residual linear roll may be determined based on only the height (z) components of mark measurements, while the parameters Rx and Ryy of the alignment model are determined at reticle level and they incorporate x- and y-position measurements, as well as direct measurements of z.

An example of this calculation will now be provided, without intending that the scope of the embodiment be limited to this specific calculation.

Remembering that each mark can be scanned (measured) by two transmission image sensors (IAS1, IAS2), and each sensor measures height from two component gratings within each mark, we can calculate the average of residuals of two measurements of each of the two component gratings and call it Z of the mark. From these averaged values are defined two parameters we will call residual wedge Rx' and residual roll Ryy'. As a first step, the following terms are calculated:

$$A = \frac{Z(R_1) + Z(R_2)}{2} - \frac{Z(R_3) + Z(R_4)}{2} \quad (1)$$

$$B = \frac{Z(R_1) - Z(R_2)}{2} - \frac{Z(R_3) - Z(R_4)}{2} \quad (2)$$

These terms A and B are related respectively to the residual wedge and residual roll parameters Rx' and Ryy'. However, they have the dimensions of height (for example in nanometers), and are not yet scaled to their proper dimensions of angle (for wedge) and angle per unit distance (for roll). Furthermore, in a practical embodiment it may be convenient to have integrity parameters expressed not as angles but in the form of height deviations, which indicate expected levels of focus error when the (contaminated) reticle is used for patterning substrates. Therefore, in the following calculation steps, the method seeks to calculate integrity parameters that have dimensions of height, but are properly scaled so to represent directly the expected focus error.

Remember that in this example the heights referred to are not measured heights of the marks, but the height deviations attributable to residual height deviations not corrected by the alignment model, which in turn are modeled as residual wedge and residual roll. The symbol Z' will be used for the residuals, to highlight the distinction. It will be understood that the actual height difference between marks (in nanometers) will depend not only on the angles of wedge and roll, but also on the spacing of the marks in x and y directions. This can be expressed in the equations:

$$Z'(R1) - Z'(R3) = y \cdot Rx' + x_{left} \cdot y \cdot R \cdot yy' \quad (3)$$

$$Z'(R2) - Z'(R4) = y \cdot Rx' + x_{right} \cdot y \cdot R \cdot yy' \quad (4)$$

where four pairs of nominal positions of marks (xi, yi) are considered (see reticle layout FIG. 4). The y distance between marks is defined:

$$y = y_{top} - y_{bottom}$$

with $$y_{top} = \max\{y_i\} \; i=1 \ldots 4$$

$$y_{bottom} = \min\{y_i\} \; i=1 \ldots 4$$

where $y_i$ are four measured y positions of a mark, and the x-left and x-right position of marks are defined $$x_{right} = \max\{x_i\} \; i=1 \ldots 4$$

$$x_{left} = \min\{x_i\} \; i=1 \ldots 4$$

Now, the term A that was calculated from the residual measurements using Equation (1) above corresponds to the term y·Rx' in Equations (3) and (4). The term B corresponds to the term $x_{right}$·y·Ryy' in Equation (4), and the term $x_{left}$·y·Ryy' in Equation (3) can be calculated from term B and the measured values $x_{left}$ and $x_{right}$. Therefore, by substituting the calculated values of A and B into the Equations (3) and (4), the method obtains properly-scaled height differences Z'(R1)–Z'(R3) and Z'(R2)–Z'(R4). These scaled height differences can then be used as integrity parameters and compared with threshold values for warning and rejection. The warning and error values can be expressed in nanometers. If either of the integrity parameters crosses the warning threshold then a warning message is initiated (step 612/712). If any of the new integrity parameters crosses the rejection threshold then the exposure operations for a lot of substrates is aborted. Initial values for the thresholds can be set and adjusted based on experience and preference. Initial threshold levels can be set based on the metrology logs of previous operations with the same types of apparatus, and may be specific to each reticle or type of reticle, if desired. An option is to set a very high threshold for the rejection, to prevent unnecessary rejections and to allow the system user to monitor the system, and set their own threshold. Again, automatic refinement of the criteria can be applied, as shown in FIG. 8. Again, reference values can be provided as part of the reference data in step 602a, 702a, against which the threshold is defined.

Of course, if desired, one can also calculate actual values for residual wedge (in dimensions of angle) and residual roll (in dimensions angle per unit distance), either for use as integrity parameters or merely for information. The example illustrates how the exact choice of integrity parameter and its expression with particular dimensions is very flexible.

In summary, the integrity test of this example has the form of steps: 608a: receive alignment model and alignment measurements; 608b: subtract alignment model heights from actual height measurements to obtain residual height values; 608c: use residual height values to calculate unscaled, residual wedge and roll parameters; 608d: from the unscaled residual wedge and roll parameters calculate scaled height-based integrity parameters; 608e: compare integrity parameters with thresholds to determine result of integrity test.

The steps here are only one illustration of how the principle of the integrity test based on residuals may be applied in a practical implementation. This particular implementation has been designed for compatibility with a particular existing software environment, and other implementations may suit other environments. The steps may be altered for example to use the parameters Rx' and Ryy' as integrity parameters, or to calculate the height-based integrity parameters directly without the intermediate step of modeling the residual wedge and roll.

While residual wedge and residual roll have been mentioned as parameters for detecting contamination causing certain types of distortion, the type of distortion will depend on the particular support mechanism applied in a given apparatus, and on the location of the contamination. Other parameters might be useful for detecting contamination in different locations, for example: residual magnification; difference in rotation Rz at the ends of the reticle (another form of linear roll).

As will be appreciated from the above, it is proposed herein to detect abnormal conditions caused by contamination around a patterning device, prior to processing substrates to apply a pattern. The detection, which can be performed in an adaptive way, uses measurement results and calculations that are already performed as part of the normal operation of the apparatus, avoiding any loss of throughput. The detection can be used to prevent patterning of substrates which will need re-working later.

The teaching from the different examples above can be combined in various ways. Integrity parameters within the same integrity test can for example include a mixture of physically-based alignment parameters or integrity parameters and polynomial coefficients. Parameters may be a mixture of absolute values and residual values, and/or a mixture of values that will be corrected in operation and those that will not be corrected.

Lithography Apparatus Control Unit LACU & Other Processors

Figure 10:
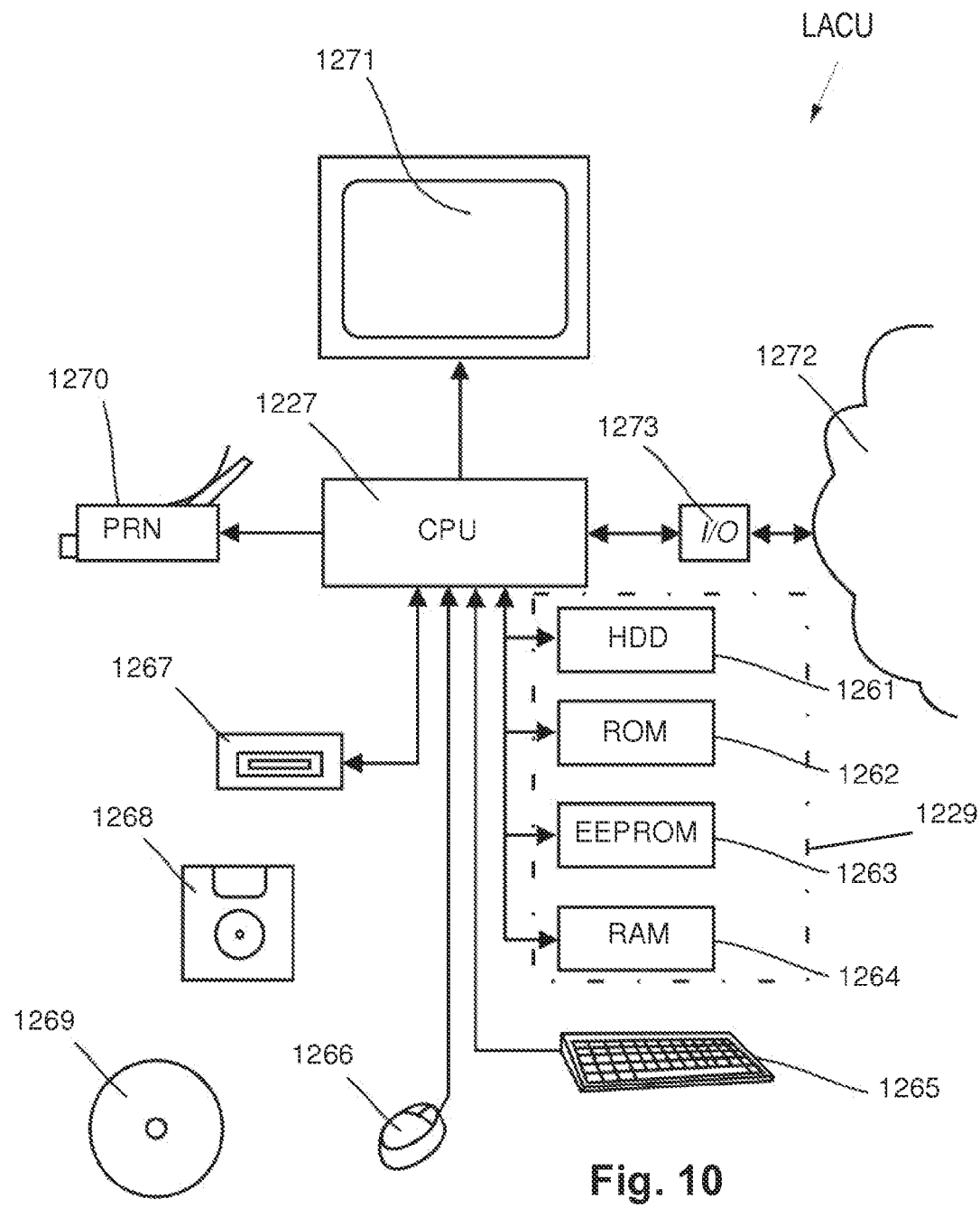
FIG. 10 is a schematic diagram of a data processing apparatus serving as a control unit in the apparatus of FIG. 1.

It should be understood that the lithography control unit LACU in the previous embodiments may be based on a computer assembly as shown in FIG. 10. The computer assembly may be a dedicated computer in the form of a control unit in embodiments of the assembly according to the present invention or, alternatively, be a central computer controlling the lithographic apparatus. The computer assembly may be arranged for loading a computer program product comprising computer executable code. This may enable the computer assembly, when the computer program product is downloaded, to implement the novel operations of the lithographic apparatus including the metrology unit, in accordance with the methods described above.

Memory 1229 connected to processor 1227 may comprise a number of memory components like a hard disk 1231, Read Only Memory (ROM) 1262, Electrically Erasable Programmable Read Only Memory (EEPROM) 1263 and Random Access Memory (RAM) 1264. Not all aforementioned memory components need to be present. Furthermore, it is not essential that aforementioned memory components are physically in close proximity to the processor 1227 or to each other. They may be located at a distance away The processor 1227 may also be connected to some kind of user interface, for instance a keyboard 1265 or a mouse 1266. A touch screen, track ball, speech converter or other interfaces that are known to persons skilled in the art may also be used.

The processor 1227 may be connected to a reading unit 1267, which is arranged to read data, e.g., in the form of computer executable code, from and under some circumstances store data on a data carrier, like a removable disc 1268 or a CDROM 1269. Also DVD's or other data carriers known to persons skilled in the art may be used.

The processor 1227 may also be connected to a printer 1270 to print out output data on paper as well as to a display 1271, for instance a monitor or LCD (Liquid Crystal Display), of any other type of display known to a person skilled in the art.

The processor 1227 may be connected to a communications network 1272, for instance a public switched telephone network (PSTN), a local area network (LAN), a wide area network (WAN) etc. by means of transmitters/receivers 1273 responsible for input/output (I/O). The processor 1227 may be arranged to communicate with other communication systems via the communications network 1272. In an embodiment of the present invention external computers (not shown), for instance personal computers of operators, can log into the processor 1227 via the communications network 1272.

The processor 1227 may be implemented as an independent system or as a number of processing units that operate in parallel, wherein each processing unit is arranged to execute sub-tasks of a larger program. The processing units may also be divided in one or more main processing units with several sub-processing units. Some processing units of the processor 1227 may even be located a distance away from the other processing units and communicate via communications network 1272. Separate processing units external to the lithographic apparatus may be used, for example, for implementing the updating of integrity criteria as described in FIG. 8.

It is observed that, although all connections in the drawing are shown as physical connections, one or more of these connections can be made wireless. They are only intended to show that "connected" units are arranged to communicate with one another in some way. The computer system can be any signal processing system with analogue and/or digital and/or software technology arranged to perform the functions discussed here.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the present invention have been described above, it will be appreciated that the present invention may be practiced otherwise than as described. For example, the present invention may take the form of a computer program containing one or more sequences of machine-readable instructions describing a method as disclosed above, or a data storage medium (e.g., semiconductor memory, magnetic or optical disk) having such a computer program stored therein. Separate program products may be provided, for example, for controlling the measurement of mark positions and analyzing the measurement results to obtain reticle alignment and integrity testing.

The descriptions above are intended to be illustrative, not limiting. Thus, it will be apparent to one skilled in the art that modifications may be made to the present invention as described without departing from the spirit and scope of the claims set out below.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A method comprising:
    measuring features of a patterning device supported in a lithographic apparatus, the results of the measuring being used in normal operation in calculating alignment parameters for use in controlling transfer of a pattern to one or more substrates; and
    performing, on the basis of the measuring, an integrity test to identify a contaminated condition of the patterning device or its support,
    wherein the integrity test comprises determining if one or more calculated integrity parameters are above a threshold, the threshold being determined based on reference data related to the patterning device,
    wherein the integrity test uses a subset of the alignment parameters that are non-correctable parameters, and
    wherein each of the non-correctable parameters represents a modeled component transformation of the pattern.

2. The method of claim 1, wherein:
    the performing comprises identifying different severity levels of contaminated conditions;
    for a first severity level, operation of the lithographic apparatus proceeds while a warning is displayed or recorded; and
    for a second severity level, operation of the lithographic apparatus is interrupted or not started.

3. The method of claim 1, wherein:
    the alignment parameters include coefficients of a polynomial alignment model mapping local deviations in the plane of the pattern, and
    the integrity test is based at least partly on values of one or more coefficients selected from the coefficients of the polynomial alignment model.

4. The method of claim 1, wherein the alignment parameters include wedge and roll parameters, and the integrity test uses one or both of the wedge and roll parameters.

5. The method of claim 1, wherein the integrity test is based at least partly on residual values of the alignment measurements, the residual values being the difference between measured values and modeled values of the alignment parameters.

6. The method of claim 5, wherein the residual values represent the difference between height values measured at a number of points on the patterning device, and height values represented by the alignment model.

7. The method of claim 1, further comprising initiating further inspection or cleaning of the patterning device in response to detection of a contaminated condition.

8. The method of claim 1, further comprising:
    making measurements of an applied pattern on one or more substrates,
    defining a modified integrity test based on the measurements of the applied pattern, and
    using the modified integrity test in future performances of the method.

9. A non-transitory computer-readable storage medium having instructions stored thereon, execution of which by a processor cause the processor to perform operations, the operations comprising:
    measuring features of a patterning device supported in a lithographic apparatus, the results of the measuring being used in normal operation in calculating alignment parameters for use in controlling transfer of a pattern to one or more substrates; and
    performing, on the basis of the measuring, one or more integrity tests to identify a contaminated condition of the patterning device or its support,
    wherein the one or more integrity tests comprises determining if one or more calculated integrity parameters are above a threshold, the threshold being determined based on reference data related to the patterning device,
    wherein the integrity test uses a subset of the alignment parameters that are non-correctable parameters, and
    wherein each of the non-correctable parameters represents a modeled component transformation of the pattern.

* * * * *